United States Patent
Dagher

(10) Patent No.: US 11,025,092 B2
(45) Date of Patent: Jun. 1, 2021

(54) WEARABLE METABOLIC ELECTRICAL CHARGING APPARATUS

(71) Applicant: HUNA, LLC, Ocean Ridge, FL (US)

(72) Inventor: Andrew Dagher, Ocean Ridge, FL (US)

(73) Assignee: HUNA, LLC, Ocean Ridge, FL (US)

( * ) Notice: Subject to any disclaimer, the term of this patent is extended or adjusted under 35 U.S.C. 154(b) by 0 days.

(21) Appl. No.: 17/086,136

(22) Filed: Oct. 30, 2020

(65) Prior Publication Data

US 2021/0135491 A1 May 6, 2021

Related U.S. Application Data

(60) Provisional application No. 62/950,915, filed on Dec. 19, 2019, provisional application No. 62/928,618, filed on Oct. 31, 2019.

(51) Int. Cl.
*H02J 50/00* (2016.01)
*H02J 50/12* (2016.01)
(Continued)

(52) U.S. Cl.
CPC ............ *H02J 50/001* (2020.01); *G10L 15/22* (2013.01); *H01L 35/30* (2013.01); *H01L 35/32* (2013.01);
(Continued)

(58) Field of Classification Search
CPC ........ H02J 50/001; H02J 7/02; H02J 7/00034; H02J 50/005; H02J 50/12; H01L 35/30; H01L 35/32; G10L 15/22; G10L 2015/223
See application file for complete search history.

(56) References Cited

U.S. PATENT DOCUMENTS 4,106,279 A * 8/1978 Martin .................... G04C 10/00
368/203
6,222,114 B1 * 4/2001 Mitamura .............. G04C 10/00
136/205
(Continued)

FOREIGN PATENT DOCUMENTS

CA 2876798 A1 * 7/2016 ............. H02S 10/30
CA 2876798 A1 7/2016
(Continued)

OTHER PUBLICATIONS

Power2Go, Charge your Phone with Body Energy, Sep. 4, 2020, http://www.power2go.com/charge-your-phone-with-body-energy/.
(Continued)

*Primary Examiner* — Jared Fureman
*Assistant Examiner* — Michael J Warmflash
(74) *Attorney, Agent, or Firm* — Lowndes, Drosdick, Doster, Kantor & Reed, P.A.; Stephen C. Thomas

(57) ABSTRACT

An apparatus for providing metabolically-generated electrical power to an electronic device such as, for example, a mobile phone, tablet or other device comprising a thermo-electric generator in electrical communication with a generating induction coil for wirelessly inductively providing power to the electronic device. In embodiments, the apparatus may be housed within an enclosure adapted to receive the electronic device. In an embodiment, the battery may be a mobile phone case. In an embodiment, the apparatus may further comprise a rotary lens selection feature for presenting optical lenses of varying powers to a camera of a mobile phone or tablet. In embodiments, the thermo-electronic device may be a Peltier module. A cell phone case of the invention may be adapted to receive a cell phone and may comprise a Peltier module and a generating induction coil
(Continued)

that either powers the cell phone directly, or charges the cell phone's battery.

30 Claims, 7 Drawing Sheets

(51) Int. Cl.
  *H02J 7/02* (2016.01)
  *H02J 7/00* (2006.01)
  *H01L 35/30* (2006.01)
  *H01L 35/32* (2006.01)
  *G10L 15/22* (2006.01)

(52) U.S. Cl.
  CPC ............ *H02J 7/00034* (2020.01); *H02J 7/02* (2013.01); *H02J 50/005* (2020.01); *H02J 50/12* (2016.02); *G10L 2015/223* (2013.01)

(56) References Cited

U.S. PATENT DOCUMENTS

| | | | | |
|---|---|---|---|---|
| 6,304,520 B1* | 10/2001 | Watanabe | ........... | G04B 37/0008 |
| | | | | 368/203 |
| 6,560,167 B1* | 5/2003 | Kotanagi | ............... | G04C 10/00 |
| | | | | 136/205 |
| 6,570,362 B1* | 5/2003 | Estes | ........................ | H01L 23/38 |
| | | | | 136/205 |
| 8,779,275 B2* | 7/2014 | Birkeland | ................. | H02J 7/00 |
| | | | | 136/207 |
| 8,915,091 B2* | 12/2014 | Goenka | ................... | B23P 15/26 |
| | | | | 62/3.3 |
| 9,485,561 B2* | 11/2016 | Anderson | ............... | H01L 35/32 |
| 9,954,156 B2* | 4/2018 | Jogia | ...................... | H02N 11/00 |
| D819,627 S * | 6/2018 | Boukai | ........................ | D14/344 |
| 10,290,796 B2* | 5/2019 | Boukai | .................. | G04G 19/10 |
| 10,446,735 B2* | 10/2019 | Wong | ................... | F28D 20/028 |
| 10,447,178 B1 | 10/2019 | Hays et al. | | |
| 10,485,478 B1* | 11/2019 | Mirov | .................. | A61B 5/1455 |
| 2006/0169314 A1* | 8/2006 | Horio | ...................... | H01L 35/30 |
| | | | | 136/205 |
| 2008/0065172 A1* | 3/2008 | Magdych | ................. | H01L 35/32 |
| | | | | 607/61 |
| 2009/0069045 A1* | 3/2009 | Cheng | ................... | H02J 7/0042 |
| | | | | 455/556.1 |
| 2013/0109440 A1* | 5/2013 | Kroll | ....................... | H04M 1/05 |
| | | | | 455/569.1 |
| 2013/0137957 A1* | 5/2013 | Wood | ................... | A61B 5/0408 |
| | | | | 600/391 |
| 2013/0315425 A1* | 11/2013 | Lunner | .................. | H04R 25/60 |
| | | | | 381/323 |
| 2014/0159638 A1* | 6/2014 | Ebersold | ............... | H02J 7/0068 |
| | | | | 320/101 |
| 2015/0179911 A1* | 6/2015 | Lemmer | .................. | H01L 35/34 |
| | | | | 136/212 |
| 2016/0049569 A1* | 2/2016 | Negrin | ...................... | H02J 7/34 |
| | | | | 136/201 |
| 2016/0050479 A1* | 2/2016 | Anderson | ............ | H04R 1/1025 |
| | | | | 381/74 |
| 2016/0268064 A1 | 9/2016 | Ishikawa et al. | | |
| 2016/0346613 A1* | 12/2016 | Schneider | ............... | A61B 5/681 |
| 2016/0351773 A1* | 12/2016 | Schneider | ............... | H01L 35/32 |
| 2016/0351774 A1* | 12/2016 | Schneider | ............... | A63B 21/00 |
| 2016/0351776 A1* | 12/2016 | Schneider | ............... | H01L 35/02 |

FOREIGN PATENT DOCUMENTS

| | | | | |
|---|---|---|---|---|
| CN | 2590196 Y | | 12/2002 | |
| CN | 206195656 U | | 5/2017 | |
| CN | 206559450 U | | 10/2017 | |
| DE | 202015008722 U1 | | 3/2016 | |
| IN | 201731011724 | * | 3/2017 | |
| JP | 2011066965 A | | 3/2011 | |
| KR | 20130118404 A | | 10/2013 | |
| KR | 20170084567 A | | 7/2017 | |
| WO | WO-2020081469 A1 | * | 4/2020 | ............ G04G 19/10 |
| WO | WO2020081469 A1 | | 4/2020 | |

OTHER PUBLICATIONS

Richard Gray, Turn yourself into a walking CHARGER: Battery harvests energy from body heat-and could one day power up mobile phones, Published Nov. 26, 2014, www.dailymail.co.uk/sciencetech/article-2848868/Mobile-phones-charge-batteries-packet-using-body-heat.html.

* cited by examiner

WEARABLE METABOLIC ELECTRICAL CHARGING APPARATUS

CROSS REFERENCE TO RELATED APPLICATIONS

This non-provisional application for patent is a non-provisional of, and claims benefit of priority to, U.S. provisional patent application Ser. 62/950,915, entitled LIGHT-WEIGHT MOBILE DEVICE BATTERY CHARGING CASE WITH VIRTUAL ASSISTANT, filed in the United States Patent and Trademark Office (USPTO) on Dec. 19, 2019; this non-provisional application for patent is also a non-provisional of, and claims benefit of priority to, U.S. provisional patent application Ser. 62/928,618, entitled MOBILE DEVICE BATTERY CHARGING CASE, filed in the United States Patent and Trademark Office (USPTO) on Oct. 31, 2019; the complete disclosures of both of which are hereby incorporated by reference in their entirety.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISK

Not applicable.

BACKGROUND OF THE INVENTION

1. Field of the Invention

The field of the invention relates generally to systems and methods for providing an electric current for powering electrical or electronic devices, or for providing an electrical charging current to operate or to charge the battery(s) of battery-powered devices, such as, for example and not by way of limitation, mobile phones, sensors, radio receivers, radio transmitters, electronic laptops or any other device that may rely upon a battery as a source of electric power. More specifically, the invention relates to the field of devices that utilize thermal-to-electric, i.e., thermoelectric, energy conversion devices to convert thermal energy to electric energy for the purpose of operating an electrical or electronic device, charging a battery, or both. Still further, the invention relates to the field of devices that utilize Peltier or Seebeck devices to convert thermal energy to electric energy for the purpose of operating an electrical or electronic device, charging a battery, or both. Still further, the invention relates to the field of devices that utilize Peltier or Seebeck devices to convert thermal energy to electric energy for powering an electromagnetic field generating inductive charging coil for wirelessly inductively charging a battery, or powering an electrical or electronic device, having a receiving inductive coil. Still further the field of the invention relates to devices that may be connected to the internet through the World Wide Web and may also be voice-activated, such as with the aid of a virtual assistant function, to perform commands or transfer audio, video or any digital information between the invention and other devices that are also connected to the internet through the World Wide Web. The field of the invention also applies to portable, or mobile, virtual assistants.

2. Background Art

The proliferation of portable, remotely used, battery-powered devices has created a need for electric power and charging systems that are adapted to operating such electrical or electronic devices, or electrically charging the batteries of such battery-powered electronic devices, with a maximum of ease, flexibility of use and portability such that a user may promptly and easily charge a battery-powered device with minimal impact to their daily activities. It would be a further advantage for the system and method of powering and/or charging to allow continuous use of the battery-powered electronic devices during the period of time while its battery is being charged.

Various charging devices exist in the prior art for the purpose of charging battery-powered devices. Battery chargers that convert electrical house current (typically at around 115 Volts Alternating Current (VAC) at around 50-60 Hz nominal frequency) to an appropriate DC voltage for charging a battery have long existed in the art. These device are presently used to provide power to electrical and electronic devices, and to charge the battery(s) of such devices. Likewise, there exist other charging devices such as solar powered devices which utilize solar cells to produce an appropriate DC current for charging the battery of a battery-powered device.

However, the battery charging devices of the prior art either require a wired connection to the power grid, such as through connection to wall electrical power outlets supplying house current, or they require bulky solar chargers or the like which are not easily carried, require sunlight to operate so that they must be utilized out of doors, and which therefore are not easily incorporated into the daily activities of most users.

Given that the usage and presence of battery-powered devices such as, for example and not by way of limitation, mobile phones, mobile tablets and other battery-powered electric and electronic devices have proliferated and increased to the extent that most users require nearly constant and uninterrupted access to such devices, a correlating need has arisen for the ability to provide enough charging current to a battery of such devices throughout daily use such that these devices remain operable on a nearly constant basis. This is especially true for those devices that may be worn on, or carried on, the body of a user, because the volume available for the batteries of such mobile devices may require the use of batteries that do not have the capacity to provide power for an entire day, and thus may require more frequent charging. This is especially true as these mobile devices continue to increase in the amount of data they process and store, the ever-increasing bandwidth at which they communicate, the number of wireless connections they be maintaining, even simultaneously, and other factors that tend to increase their power consumption.

One specific problem of the present state of the art associated with the electrical power-providing systems of the art is the use of wired electrical interconnects as the medium by which electrical power, or current, is provided by the electrical power-providing system to the electrical or electronic system, or battery, e.g. a mobile device, receiving the electrical power or current. The wires and connectors used in such wired systems are prone to failure and breakage through repeated connect/disconnect cycles and through the mechanical stresses associate with mobile use, especially in those applications in which may require the use of the electrical power-providing system in harsh, wet, hot, cold, dirty, or other environments. During such use, the electrical power-providing system interconnection to the electrical or electronic system, or battery, e.g. a mobile device, receiving the electrical power may be achieved by connectors in which electrical conductors are pressed together inside the electrical connection. Physical stresses, contaminants, fluids, corrosion and other resistivity-producing instrumentalities may, and often do, eventually cause the electrical interconnection to increase in electrical resistivity and to eventually fail altogether such that it no longer passes electrical current, and thus fails to provide the needed electrical power or current to the electrical or electronic system, or battery, e.g. a mobile device, receiving the electrical power. This problem of the prior art is exacerbated when the mobile device is utilized in particularly hot, cold, wet, corrosive, or mechanically stressful environments.

Further, the availability of an electrical grid to provide AC power or DC power to a charging devices is not something that can be counted on. Remote locations, mobile environments or applications, disaster areas or other areas in which the electrical power grid is non-operational, are all examples of geographic areas that may not have electrical power available for charging a mobile device.

Still further, there exist extra battery packs that a user may carry, and, when needed, such battery packs may be connected to the mobile device through a wired connection using the electrical connector on the mobile device such that the extra battery or batteries are able to provide electrical power to provide operating power, or to charge the battery of, the mobile device. However there are drawbacks to the use of extra battery packs in this manner. Such battery packs are heavy; easily lost or stolen; require storage which may be problematic for users who are highly mobile; are not primary sources of electrical energy but are merely additional storage elements which may be subject to accidental discharge, rendering them useless; have limited lifetime charging/discharging cycles; and are subject to the problems associated with wired interconnections as described above.

U.S. Pat. No. 10,446,735 to Wong, et al., entitled TECHNIQUES FOR TRANSFERRING THERMAL ENERGY STORED IN PHASE CHANGE MATERIAL and assigned to Intel Corporation, which issued from the USPTO on Oct. 15, 2019 ("Wong"), describes an apparatus and method to receive thermal energy from a source, convert phase change material from an initial state to a secondary state in response to absorption of the thermal energy, and transfer the thermal energy from the phase change material to a thermoelectric component for converting the thermal energy into electrical energy for use in powering one or more electronic components. However, the device taught by Wong has drawbacks, including being subject to the problems associated with wired interconnections as described above.

International Publication WO 2020/081469 A1, published under the Patent Cooperation Treaty on Apr. 23, 2020 from International Application No. PCT/US2019/056157 filed in the USPTO on Oct. 14, 2019, inventors Tham et al., entitled THERMOELECTRIC SYSTEMS WITH THERMALLY CONDUCTIVE MATERIALS, ("Tham"), describes an electronic device comprising a heat collecting unit, a thermoelectric generator, thermally conductive material, and a heat expelling unit. The present disclosure also provides a method for collecting thermal energy comprising providing an electronic device comprising a heat collecting unit, a thermoelectric generator, thermally conductive material, and a heat expelling unit; and positing the electronic device so that the heat collecting unit is disposed adjacent to a body surface of the user. However, the device taught by Tham has drawbacks, including being subject to the problems associated with wired interconnections as described above.

U.S. Pat. No. 10,290,796 to Boukai, et al., entitled THERMOELECTRIC DEVICES AND SYSTEMS and assigned to Matrix Industries, Inc., which issued from the USPTO on May 14, 2019 ("Boukai"), describes wearable electronic devices with thermoelectric devices. The wearable electronic device may comprise a user interface for displaying information to a user. The thermoelectric device may comprise a heat collecting unit, a thermoelectric element, and a heat expelling unit. During use, the thermoelectric element may generate power upon the flow of thermal energy from the heat collecting unit, across the thermoelectric element, and to the heat expelling unit. However, the device taught by Boukai has drawbacks, including not being adaptable for use on an aftermarket basis; i.e., not being usable with any pre-existing mobile device, and also being subject to the problems associated with wired interconnections as described above.

U.S. Pat. No. 9,954,156 to Jogia, entitled BODY HEAT POWERED WIRELESS TRANSMITTER which issued from the USPTO on Apr. 24, 2018 ("Jogia"), describes a body heat powered portable wireless transmitter containing a thermoelectric generator, an energy harvesting system, a control system and a wireless transmitter. The wireless transmission medium could include but not exhaustively, RF, Ultrasonic or Infrared. The application can range from a key fob transmitter or a remote keyless entry (RKE) system for a car, an infrared remote control for a TV or Hi-Fi or a person location device which can be worn around the wrist like a watch to allow hospital staff to track Alzheimer's patients, allow parents to track their children, detect trapped people from the effects of earthquakes and tsunamis or an RF ID tag for security purposes. The device can also be used for sensor applications (wireless data capture) such as a fitness tracker or health monitor such as a wireless ECG (electrocardiogram) monitor to collect patient vitals and wirelessly transmit the data to hospital staff. However, the device taught by Jogia has drawbacks, including that it is not adapted provide electrical power to an external receiving device such as a mobile device, and being subject to the problems associated with wired interconnections as described above.

Indian patent application no. 201731011724, filed in the Indian Patent Office on Mar. 31, 2017, entitled SMARTPHONE FLIP COVER CHARGER, inventor Dr. Biswarup Neogi et al. ("Neogi"), describes a smartphone flip cover charger. This invention relates to a smartphone flip cover charger in which Peltier generators are connected on the outer layer of the cover. This invention relates to a smartphone flip cover charger in which the solar energy processor stage does the same by cutting of the excess energy instead of shunting. This invention relates to a smartphone flip cover charger in which the Peltier will receive heat from sunlight and cold from car interior air conditioning system being one side hot and one side cold and this temperature variance in the segment will start generating electricity. However, the device taught by Neogi has drawbacks, including that it is not adapted provide electrical power to an external receiving device such as a mobile device, it is not adaptable to being worn on or near the body of a user such that it is in thermal communication with the body of a user, and it is subject to the problems associated with wired interconnections as described above.

Canadian patent application no. CA 2876798 A1, filed in the Canadian Intellectual Property Office on Jan. 7, 2016, inventors Josee, Malette et al., entitled THERMOELEC- TRIC CHARGING CASE FOR HANDHELD ELECTRONIC DEVICE, ("Malette"), describes a flexible case for a handheld electronic device that converts thermal energy produced by the device into direct current used to trickle charge the internal battery of said device. The case comprises a thermoelectric element for the conversion of thermal energy into electrical energy, an adapter to transmit direct current from the thermoelectric element to the internal battery of the handheld electronic device, and a cooling compartment to maintain a temperature difference across the thermoelectric element. The case further includes a flexible exterior shell, which permits the case to accommodate handheld electronic devices of various shapes and sizes. However, the device taught by Malette has drawbacks, including that it requires a cooling compartment wherein temperature-regulated aqueous dissolution of a polymer salt occurs for the purpose of maintaining a temperature difference across the thermoelectric element, and it is subject to the problems associated with wired interconnections as described above.

U.S. Pre-Grant Patent Application Publication No. US 2016/0049569 AI, published by the USPTO on Feb. 18, 2016, inventor Barry E. Negrin, entitled THERMOELECTRIC POWER SOURCE FOR PERSONAL ELECTRONICS AND WEARABLE ELECTRONIC DEVICES HAVING SAME ("Negrin"), describes a wearable electronic device, an alternative power source for a wearable electronic device, and a method of powering a wearable electronic device. The device includes a casing and electronics disposed therein. A thermoelectric generator such as a Peltier device is provided in electrical communication with the electronics; a heat absorbing side is in thermal communication with the wearer of the wearable electronic device when the device is worn. When the electronic device is worn by a wearer, body heat from the wearer is absorbed by the heat absorbing side and converted into electricity by the Peltier device which at least partially powers the electronics. At least one fin is provided in thermal communication with the heat releasing side, drawing heat away from the Peltier device. The fin is disposed substantially through the casing with the distal end terminating substantially at a top side of the casing. However, the device taught by Negrin has drawbacks, including that it is not adapted provide electrical power to an external receiving device such as a mobile device, and being subject to the problems associated with wired interconnections as described above.

U.S. Pre-Grant Patent Application Publication No. US 2014/0159638 A1, published by the USPTO on Jun. 12, 2014, inventor Sean Lawrence Ebersold, entitled PORTABLE ENERGY HARVESTING, STORING, AND CHARGING DEVICE ("Ebersold"), describes a portable energy harvesting, energy storage and battery charging device. The portable device consistent with embodiments of the invention may be worn as, for example, a wrist application. The portable device may incorporate any one of, or a combination of, thermoelectric and solar energy harvesting technology as a source for charging, for example, at least one rechargeable battery. The energy may be stored for later use to, for example, recharge portable electronic devices on the go. In various embodiments, the portable device may be configured to provide a time, date and energy supply in a convenient display. Furthermore, the portable device may incorporate, into its design, integrated Universal Serial Bus (USB) connectors for convenient and direct charging of other portable electronic devices. The USB connector may also be configured to cause a charging of the battery of the portable device. However, the device taught by Ebersold has drawbacks, including being subject to the problems associated with wired interconnections as described above.

U.S. Pat. No. 8,779,275 to Birkeland, et al., entitled THERMOELECTRIC GENERATOR BATTERY CHARGER AND POWER SUPPLY which issued from the USPTO on Jul. 15, 2014 ("Birkeland"), describes a portable device for supplying with power of at least one portable electrical load or gadget, wherein the device is adapted to be manually heated and comprises at least one thermoelectric element having one hot or warm side and one cold side, a container attached to the cold side and adapted for holding or keeping a cooling medium or fluid therein, a power converter and a set of cables coming out of the thermoelectric element and connected to the electrical load via the power converter. However, the device taught by Birkeland has drawbacks, including that it requires a container attached to the cold side and adapted for holding or keeping a cooling medium or fluid therein, and it is subject to the problems associated with wired interconnections as described above.

U.S. Pat. No. 6,570,362 to Estes, et al., entitled PORTABLE ELECTRONIC DEVICE WITH ENHANCED BATTERY LIFE AND COOLING which issued from the USPTO on May 27, 200 ("Estes"), assigned to Motorola, describes a thermoelectric module and phase change material module are placed near a heat source in an electronic device. The thermoelectric module and phase change material module insulate a surface to be cooled on the electronic device. The thermoelectric module generates an electrical current in response to a temperature differential at opposite surfaces on the thermoelectric module. The phase change material module enhances or limits the temperature differential seen at the thermoelectric module. The electrical current generated by the thermoelectric module is used to charge a battery of the electronic device. However, the device taught by Estes has drawbacks, including that it is not wearable, does not utilize metabolic energy, and is subject to the problems associated with wired interconnections as described above.

With regard to the aforementioned references, there may be other drawbacks to the apparatuses, methods, embodiments and structures taught by theses references, other than the drawbacks identified above. The drawbacks identified above are not intended to be an exhaustive recitation, but are, rather, exemplary in nature.

What is needed in the art, therefore, is a metabolically-powered apparatus and/or method adapted for charging a battery in a battery-powered electric or electronic device such as a mobile phone, mobile tablet, smart phone, smart watch or any other device that utilizes a battery as a source of electric current. Preferably such an apparatus would be lightweight, durable, and easily adaptable into the daily activities and lifestyle of the average user. Such an apparatus would preferably be small enough to be easily carried by a user and would not require an external source of electric power. Furthermore, it would be desirable that such an apparatus would not require a wired electrical connection to the battery which it is charging in order to reduce the complexity of use, increase portability and increase the reliability of the charging device by eliminating any likelihood of electrical failure due to failure of wiring or electric connection between the charging device and the battery to be charged. It is also desired that the charging device be adapted to be used by any mobile device after manufacture, i.e., as an aftermarket product. Still further, it would also be desirable that the charging device be connected to the internet through the World Wide Web for the purpose of performing tasks in response to commands, which may be voice commands, such tasks possibly including, for example and not by way of limitation, transferring audio, video or any digital information between the invention and other devices that are also connected to the internet through the World Wide Web.

It is also desirable that the functionality of a home virtual assistant, such as Google Home® or Amazon Alexa®, be provided by the invention, so that a user is able to access and utilize the functions of the virtual assistant while away from home for any reason.

BRIEF SUMMARY OF THE INVENTION

The present invention comprises an apparatus and method that have one or more of the following features and/or steps, which alone or in any combination may comprise patentable subject matter, and which address and resolve the aforementioned shortcomings of the prior art, and provides, in any combination, the features and benefits described above as being desirable.

The present invention overcomes the shortcomings of the prior art in that, in embodiments, it provides for effective, efficient power of an electronic device, or charging of an electronic device battery, without the need for any direct conductive (i.e. wired) electrical connection between the apparatus of the invention and the device being powered, or the battery undergoing charging. In embodiments, the apparatus of the invention enables the powering of a an electronic device, or the charging of an electronic device battery, while the electronic device is worn or carried on the body of a user. The electronic device may be, for example, a cellular phone, a smart phone, a wearable electronic device, an electronic tablet, or any mobile device.

Thus, in the exemplary case in which the mobile device is a mobile or cellular phone, a user may power the mobile phone, or charge a battery of the mobile phone, while the mobile phone is carried on the user's body while at the same time using the device to make phone calls or listen to music, podcasts or the like, for example via wired or wireless earbuds, headphones, speakers or other input-output audio devices. For example, in the case of a mobile smart phone, the mobile smart phone may be powered, or have its battery charged, or both, by the apparatus and method of the invention while the mobile smart phone is carried in the pocket of, or worn on the body of, a user; or while the user is making use of desired mobile smart phone features such as, for example, music or podcast streaming or replay, the placing of phone calls, or the use of the mobile phone's virtual assistant and the like.

In accordance with one embodiment of the present invention, the invention comprises an apparatus for powering an electronic device or for charging a battery of an electronic device, that may include any of the following features or elements: an enclosure, such as, for example, a cell phone case, for receiving the electronic device; a thermoelectric device having an exterior-facing portion and an interior-facing portion, in which the exterior-facing portion may be in either direct or indirect thermal communication with the body of a user such that the user's body temperature causes the temperature of the exterior-facing portion of the thermoelectric device to be greater than the temperature of said interior-facing portion of said thermoelectric device; a generating induction coil, in electrical communication with the thermoelectric device, that generates an electromagnetic field in response to said electric current, wherein said generating induction coil is disposed within said enclosure; wherein the generating induction coil converts the electric current into an electromagnetic field for inductively communicating energy to a receiving induction coil when the electronic device is received by the enclosure, causing the receiving induction coil to be placed within the electromagnetic field of said generating induction coil, and wherein the receiving induction coil is in electrical communication either with the electronic device, or with a battery providing electrical power to said electronic device, such that a resulting current produced in the receiving conduction coil when the receiving induction coil is placed within the electromagnetic field of the generating induction coil provides electric current, or energy, either to 1) the electronic device for powering the electronic device directly in the case in which said receiving induction coil is in electrical communication with the electronic device, or 2) the battery in the case in which the receiving conduction coil is in electrical communication with the battery of the electronic device.

In embodiments, the electromagnetic field may be a resonant electromagnetic field.

In embodiments, the electromagnetic field may be an alternating electromagnetic field.

In embodiments, the thermoelectric device may be a Peltier device, a thermoelectric cooler operated as a generator, or a thermoelectric generator of any type or form that converts thermal energy to electrical energy.

In embodiments, the electronic device may be further defined as a mobile phone, and the enclosure may be a mobile phone case.

In embodiments, the enclosure may further comprise at least one ventilating opening allowing ventilating air from outside the enclosure to enter the enclosure and circulate near the thermoelectric device, cooling the thermoelectric device.

In embodiments, the at least one opening may be covered by a watertight breathable fabric, or membrane, that allows ventilating air to pass through the ventilating opening, but does not allow water to pass through the ventilating opening.

An advantage of the embodiments of the invention in which the enclosure comprises carbon fiber is that such embodiments may be thinner, lighter and more impact resistant than those embodiments that do not comprise carbon fiber.

In embodiments, the exterior-facing portion of the thermoelectric device may form a portion of an exterior surface of the enclosure. In such embodiments the thermoelectric device may be in thermal communication with the body of user such that heat from the user's body is communicated to the invention, producing electrical current that may be used to power a mobile device or to charge the battery of a mobile device.

In embodiments, the thermoelectric device may be located adjacent to the body of a user, and in either direct or indirect thermal communication with a portion of the user's body, for example, the skin of the user, in a manner such that electric current generated by the thermoelectric device is communicated to the generating induction coil by electrically conductive wiring. Thus, in embodiments, the thermoelectric device may be remotely located from the enclosure of the device and may be, for example, attached to, or near, the skin of a user by any means known in the art such as a strap, an elastic band, or any other means for attaching a device to a portion of a user's body. In this manner, the thermal communication between the body of the user and the thermoelectric device may be optimized to provide more current from the thermoelectric device, and thus provide more electrical power or current to the electronic device or its battery.

In embodiments, the invention may comprise a rotary lens system for selecting one of a plurality of optical lenses to be disposed in the optical path of a camera lens of a mobile device when the mobile device is disposed in the enclosure. The rotary lens system may comprise a plurality of optical lenses, each of the lenses comprising the plurality of lenses being of a different optical power. The rotary lens system may comprise a hub rotably connected to an exterior portion of the enclosure. In embodiments, the optical power of each of the plurality of lenses may be any optical power, but may be selected from the group consisting of 15× optical power macro lens, a 3× telephoto lens, 0.63× wide angle lens, a 1× lens, no lens, or a 180 fisheye lens.

In embodiments, the invention may comprise composite carbon fiber construction in order to achieve light weight and durability. The carbon fiber material may be thermally conductive, electrically conductive, or both. The carbon fiber material may comprise other materials, particles or chemical structure to increase its thermal conductivity.

In embodiments, the invention may take the form of a mobile phone case that is useful for, and adapted to, receive, store and/or carry a mobile device while it is worn on the body of a person, in thermal communication with the user's body such that heat from the user's body is communicated to the invention, producing electrical current that may be used to power a mobile device or to charge the battery of a mobile device.

In embodiments, the invention may comprise a processor in communication with a physical memory, which may be any storage media capable of storing non-transitory computer readable and executable instructions otherwise known as software. The processor may also be in communication with a microphone or a speaker, or both, either directly or through an audio processor capable of converting analog audio information into digital form for processing by one or more processors, or capable of converting digital information into analog audio information. The processor may also be in communication with an input/output port, such as an Radio Frequency communication port, a wired communication port, or optical communication port, for example WiFi or Near Field Communication (NFC) port, for communicating with the electronic device, which may be, for example, mobile device or cell phone that may be disposed in and retained by the enclosure of the invention.

In embodiments, the storage media may contain computer readable and executable instructions for responding to voice audio commands from the user for carrying out tasks such as, for example and not by way of limitation, providing system status including but not limited to electronic device battery charge status, present charging current status and the like. Such commands may be received by the processor and communicated to a mobile device that is retained in the enclosure of the invention, whereupon one or more processors within the mobile device may execute computer readable and executable instructions for interrogating mobile device status and communicating such status to the processor of the invention. This communication may occur wirelessly through RF or optical means such as, for example, WiFi, or may be communicated through a wired connection between a processor of the mobile device and a processor of the invention.

In embodiments, a virtual assistant may be implemented in software that is stored in the physical storage media of the apparatus of the invention.

In embodiments, the virtual assistant may be operable to receive commands from a user, such as verbal audio commands. The virtual assistant may in communication, usually but not necessarily wirelessly, with at least one external electronic device and may be operable to control the at least one external electronic device by communicating control commands to the external electronic device.

A further distinct advantage of the embodiments of the invention comprising a virtual assistant is that the invention allows a user to take their virtual assistant with them wherever they travel or are away from home for any reasons. By incorporating virtual assistant technology as described herein, a user of the invention is able to have access to their home virtual assistant from any location, and at any time. The invention frees the user from being required to remain at home in order to utilize the functions of the virtual assistant because the virtual assistant functions are incorporated in the invention.

The present method and device of the invention overcome the shortcomings of the prior art by using an external source of heat, such as a portion of the body of a user, to cause a temperature differential across a thermoelectric device thereby producing a voltage differential across the leads of the thermoelectric device and causing current to flow through a generating induction coil that is in electrical communication with the thermoelectric device, generating an electromagnetic field that produces a resulting current in a receiving induction coil when the receiving induction coil is placed within the electromagnetic field of the generating induction coil provides electric energy either to 1) said electronic device for powering the electronic device directly in the case in which the receiving induction coil is in electrical communication with said electronic device, or 2) said battery in the case in which said receiving induction coil is in electrical communication with said battery for inductively charging a mobile device battery. The present method and device of the invention overcomes the shortcomings of the prior art by allowing a user to power an electronic device such as a smart phone or smart watch, or to charge a battery of an electronic device, while the mobile device is carried on the body of a user during daily activities. In embodiments the user is able to use the mobile device for its intended functions while it is being inductively powered or charged by the invention. This allows the mobile device user to charge their mobile device battery while using the device, all without any need for an external source of electric power. The invention enables practically continuous, uninterrupted use of an electronic device without the worry of running out of battery power. This, in turn, may enable the use of smaller batteries or other energy storage technologies having less capacity, reducing cell phone the size and weight, resulting in increased portability and lowered cost of the electronic device. In embodiments, the use of chemical batteries to power the electronic device may not be necessary, as the power requirements for the electronic devices are reduced through advancements in semiconductor technology such as reducing the size of semiconductor transistors and diodes well below the sub-micron level, or the use of alternative semiconductor or even quantum logic device structure technology. Still further, advancements in power management of electronic devices that result in much lower electrical power requirements may also continue to reduce the electrical power required to operate such electronic devices. By combining the metabolic energy producing apparatus of the invention with such advancements in the state of the art of electronic device power management, electronic device batteries may be eliminated altogether and replaced with other energy storage technologies, such as capacitive storage technologies, thus eliminating the need for environmentally damaging production and disposal of millions upon millions of chemical batteries. Thus there is a significant environmental advantage of the present invention.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating the preferred embodiments of the invention and are not to be construed as limiting the invention. In the figures of the drawing, like callouts refer to like elements. In the drawings.

DETAILED DESCRIPTION OF THE INVENTION

Figure 1:
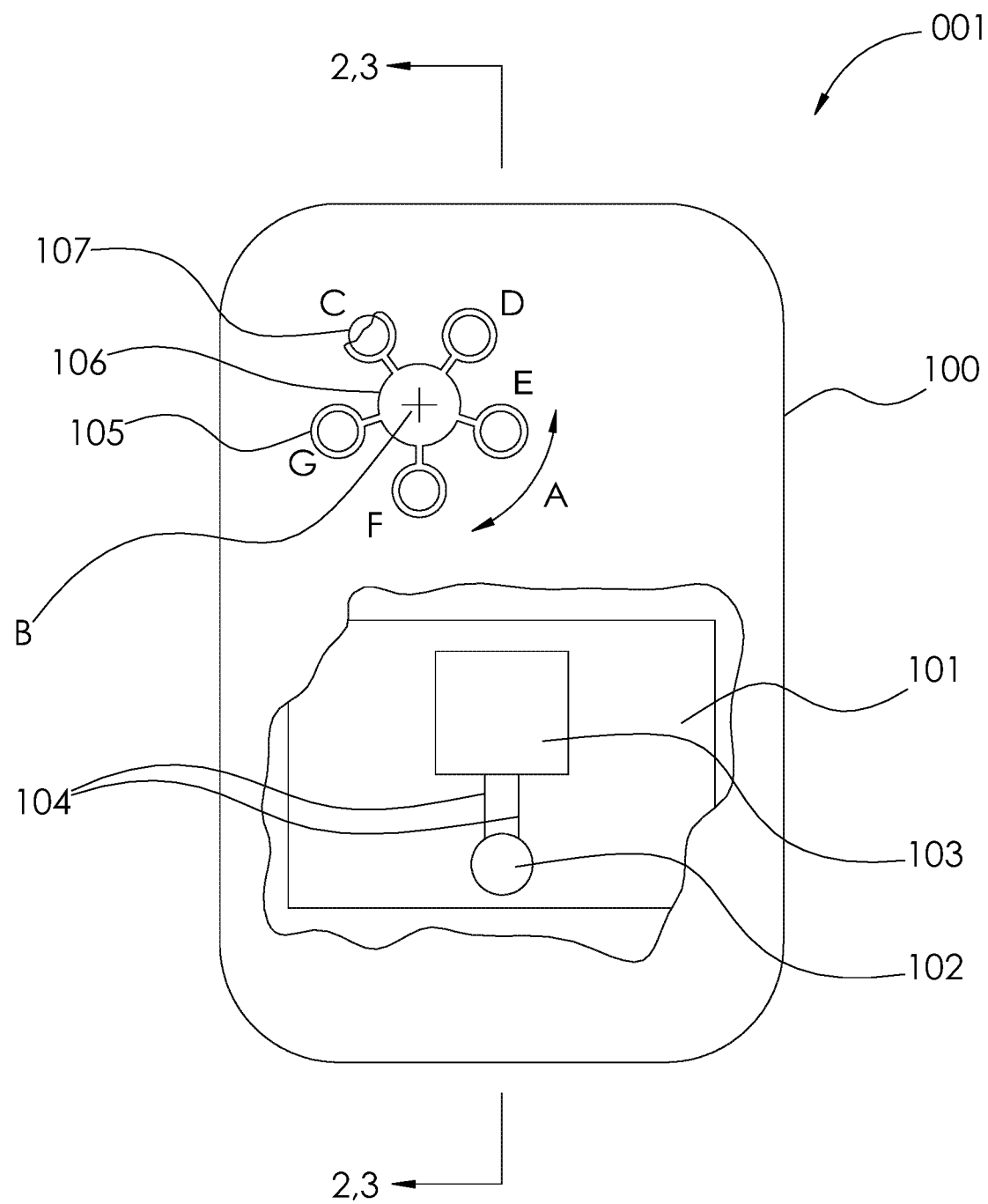
FIG. 1 depicts a rear view of an embodiment of the invention.

The following documentation provides a detailed description of the invention.

Although a detailed description as provided in the attachments contains many specifics for the purposes of illustration, anyone of ordinary skill in the art will appreciate that many variations and alterations to the following details are within the scope of the invention. Accordingly, the following preferred embodiments of the invention are set forth without any loss of generality to, and without imposing limitations upon, the claimed invention. Thus the scope of the invention should be determined by the appended claims and their legal equivalents, and not merely by the preferred examples or embodiments given.

As used herein, "thermoelectric device" and "thermoelectric module" includes within its meaning, but is not limited to, devices known as Peltier devices, Peltier modules, Peltier coolers, Peltier heat pumps, thermoelectric generators, thermoelectric coolers (TECs), and devices that may operate under the Peltier, Seebeck or Thompson principles. These are but exemplary embodiments of thermoelectric device of the invention. In embodiments, a thermoelectric device of the invention may be any thermoelectric generator. In the thermoelectric device of the invention, a difference in voltage will be present between two sides, or output ports, of the device in the presence of a temperature differential between the two sides of the device. In embodiments, the building of the charge may be a result of the Seebeck, Peltier or Thompson effect, such as, for example, in a Peltier device or module. Thus, "thermoelectric device" includes within it's meaning any device that converts a difference in temperature between portions of the device to a voltage differential across electrical leads of the thermoelectric device that are each in electrical communication with a portion of the thermoelectric device. The difference in voltage potential may be present in electrical leads, or terminals, that are in electrical communication with the portions of the thermoelectric device that are held at different temperatures. Such thermoelectric devices may operate on any theory. Exemplary, non-limiting devices are those that may operate using the Seebeck, Peltier or Thompson effect, or any combination of these effects. These effects, generally, may be thermodynamically reversible, i.e., the application of a temperature differential across portions of the device may result in the generation of a voltage differential, and the application of a voltage differential across terminals of the device may generate a temperature differential across portions of the device.

As used herein, "Seebeck effect" includes within its meaning conversion of heat directly into electricity at the junction of two or more conductors or semiconductors of differing material composition.

As used herein, "Peltier effect" includes within its meaning the conversion of heat energy directly to electrical energy that occurs in a device comprising two electrical conductors or semiconductors of differing material composition when the two materials are subjected to a temperature differential as between them.

As used herein, "Thompson effect" includes within its meaning the phenomenon that occurs when a current is induced to pass through a conductor or semiconductor by the presence of a temperature gradient in the conductor or semiconductor.

As used herein, "electromagnetic wireless charging" includes within its meaning any type of wireless charging that uses an electromagnetic field to transfer energy between two objects using electromagnetic induction. Electromagnetic wireless charging may be accomplished by the use of an induction charger comprising a generating induction coil that creates a changing, or alternating, electromagnetic field, where a receiving induction coil placed within the alternating electromagnetic field will develop an electric current in the presence of the electromagnetic field. In this manner, electric power is transferred wirelessly from the generating induction coil to the receiving induction coil through the changing electromagnetic field. In embodiments, the electromagnetic wireless charging of the invention may comprise resonant inductive coupling for greater charging efficiency.

As used herein, "battery powered", "battery powered device", "battery powered user device" and "battery powered electronic device" includes within their meaning any device that utilizes electric power to operate in which the electric power is provided by a battery or plurality of batteries. By way of non-limiting example, "battery-powered device" includes within its meaning cell phones, electronic tablets, smart watched, wearable electronic devices, paging devices, radios, and any other device that utilizes electric power to operate, in which the electric power is provided by a battery or a plurality of batteries. While the specific examples given in the disclosure of this invention may discuss mobile phones, it is understood that this is for convenience only for sake of disclosure but that it is within the scope of the claimed invention to include any and all battery-powered electric devices. It is not necessary that the battery of a battery-powered user device be co-located with the electronic or user device itself.

As used herein, "electronic device" includes within its meaning any device that comprises circuitry for performing a function, and wherein the circuitry requires electric power, or current, to operate. Mobile devices fall within the meaning of "electronic device".

As used herein, "mobile device" includes within its meaning any electronic device that is intended to be portable or wearable such that it is carried by, or worn on a portion of a body of, a person or user during the conducting of normal daily activities. Non-limiting examples of mobile devices are cell or smart phones, wearable electronic devices, wearable personal fitness devices, wearable GPS devices, portable music players, and electronic tablets.

As used herein, "sorbothane" includes within its meaning a synthetic viscoelastic urethane polymer generally used as a shock absorber and vibration damper.

As used herein, "neoprene" includes within its meaning any product from a family of synthetic rubbers that are produced by polymerization of chloroprene.

As used herein, "circuit" and "circuitry" includes within their meaning at least all of the following: hardware-only implementations (such as implementations in only analog and/or digital circuitry) and combinations of circuits, passive and active electronic components, integrated electrical devices, processors, microprocessors, programmable logic devices, and software and/or firmware such as any combination of processors or portions of processors/software including digital signal processor(s), software, and physical memory(ies) (i.e. physical storage media such as solid state media comprising non-transitory computer readable and executable instructions) that work together to cause an apparatus of the invention to perform various functions, and circuits, such as a microprocessor(s) or portion of a microprocessor(s), that require software or firmware for operation, even if the software or firmware is not physically present. As used herein, "software" includes within its meaning non-transitory computer readable and executable instructions that may be stored in physical storage media such as solid state memory that are read by, and executed by, a controller, processor or other circuitry. This definition applies to all uses of these terms in this application, including in any claims.

As used herein, "controller", "processor" and "microprocessor" includes within their meaning any circuitry capable of reading and executing non-transitory computer readable and executable instructions that may be stored in physical storage media such as solid state memory for performing a particular function. Such circuitry may be implemented in any form such as integrated circuits, programmable gate arrays, programmable logic devices, discrete logic, software, hardware or firmware, in any combination.

As used herein, "carbon fiber" includes within its meaning any fiber comprised mostly of carbon atoms that are bonded together in crystals that are more or less aligned parallel to the long axis of the fiber as the crystal alignment gives the fiber high strength-to-volume ratio (in other words, it is strong for its size). Several thousand carbon fibers may be bundled together to form a tow, which may be used by itself or woven into a fabric. Carbon fibers are typically combined with other materials to form a composite. When a fabric of carbon fiber is impregnated with a polymer or plastic resin and baked to a high temperature, a structure called carbon-fiber-reinforced polymer (often referred to simply as carbon fiber) which has a very high strength-to-weight ratio, and is extremely rigid, may be formed. Carbon fibers may also be composited with other materials, such as graphite, to form reinforced carbon-carbon composites which have a desired characteristic such as very high heat tolerance, or a desired electrical conductivity. As used herein, "carbon fiber" includes within its meaning any structure comprising carbon fiber or graphite fiber, including but not limited to structures that are formed by impregnating carbon or graphite fiber fabric with a plastic resin or matrix material which is subsequently cured. "Carbon fiber", as used herein, also includes within its meaning carbon-fiber-reinforced polymer and any other structure commonly referred to as comprising carbon fiber as would be understood by a person of ordinary skill in the art.

As used herein, "virtual assistant" and "intelligent virtual assistant" include within their meanings a software agent that can perform tasks or services for a user based on commands or questions spoken by the user, and received by the audio interface and processor of the invention. In embodiments, the virtual assistant is able to interpret human speech and respond via synthesized voices, by performing commanded tasks, or both. Users may present questions or queries resulting in audio answers, control external devices, and control media playback via voice. Users may also manage other basic tasks such as email, to-do lists, and request system status with audio commands. In embodiments, the virtual assistant may comprise Google Home® or Amazon Alexa®, or systems with the same features as Google Home® or Amazon Alexa®. Virtual assistants may include any of the above attributes or features, in any combination. This list is not exhaustive. The virtual assistant function may communicate with external devices through communication port 505 of the invention (see FIG. 5), which may comprise RF, optical or wired communications interface functionality via established industry communication standards such as Bluetooth, WiFi, Zigbee, NFC or other standards.

As used herein, "software" includes within it's meaning any set or compilation of computer readable and executable instructions.

As used herein, "external electronic device" includes within its meaning any device that is able to be commanded or controlled by receiving a signal, usually but not necessarily a wireless signal. In the cases in which the external electronic device is operable to receive wireless command signals for controlling the external electronic device, such wireless command signals may be any type of wireless signal known in the art, analog signal or digital signal or a combination of analog and digital signals. Such wireless command signals may be Radio Frequency (RF), optical, electromagnetic or wired and may conform to industry standards such as IEEE 802.11 WiFi®, IEEE 802.15 ZigBee®, Bluetooth or other industry standards. External electronic devices may be controlled by such wireless command signals to, for example and not by way of limitation, power on; power off; adjust channel selections for streaming information received from a external system; stream audio or video signals; adjust volume; set parameters in the case in which the external electronic device is operable to control other devices, such as, for example, a thermostat controlling heat, ventilation and air conditioning systems; and retrieve information from remote servers through secondary networking means such as the Internet or any other network and to communicate such information to a user through visual display or audio means such as a speaker. These are but examples of what is meant by "external electronic device".

As used herein, "metabolically-generated electrical power", "metabolically-generated energy" and "metabolically-generated current" means electrical energy or power that is generated by a thermoelectric generator to convert heat energy produced by the physical body of a person, who may be the user of the invention, into electrical current or energy that can be used for any purpose, including but not limited to providing power to an electronic device, or providing an electrical charging current to a battery, which may provide power to, for example, an electronic device.

While the figures of the drawings depict the apparatus of the invention embodied as an enclosure, or case, adapted to receive an electronic device such as, for example, a mobile device (for example, a cell phone case), the invention includes within its scope any embodiment that comprises a thermoelectric device in electrical communication with a generating induction coil for electromagnetically wirelessly charging a battery operated device by generating an electromagnetic field, and wherein a receiving induction coil placed within the electromagnetic field that is in electrical communication with an electronic device, or a battery providing power to an electronic device, such that a current developed in the receiving induction coil due to its presence in the electromagnetic field is supplied to either the electronic device directly, thus powering the operation of the electronic device, or provides electric current to the battery, causing the battery to be charged.

The invention may also comprise a controller in communication with the receiving induction coil and the battery for the purpose of controlling, or managing, the amount of charging current applied to the battery, or discharge/recharge cycling of the battery, in order to achieve the most effective charging current profile for a specific battery chemistry in order to balance needs for quick charging and extending useful battery life.

Further, any embodiment of the invention may comprise any or all of the described features of the invention, in any combination.

Referring now to FIG. 1, a rear view of an embodiment of the invention is depicted. In this exemplary embodiment, the invention 001 may take the form of an enclosure for a mobile device, such as, for example and not by way of limitation, a mobile phone, smart watch or cell phone case. The enclosure 100 may serve the function of providing a protective case or covering for a mobile device 002 (not shown in FIG. 1 but depicted in FIGS. 2, 3 and 4). The enclosure may be wearable on the body of a user. It may also provide a metabolically-generated electrical power function using a thermoelectric device that is in thermal communication with a portion of the body of a user, as well as provide a plurality of lenses for use with a camera disposed in the mobile device. In an exemplary embodiment, the invention 001 may comprise a electronic device enclosure, or case, 100. The electronic device enclosure 100 may comprise a thermoelectric device 103 in electrical communication with a generating induction coil 102 via electrical conductors 104, which may be electrical conductor 104 which may comprise, for example, electrically conductive wires. The location of generating induction coil 102 may be such that generating induction coil 102 produces an electromagnetic field 200 (not depicted in FIG. 1 but depicted in FIG. 4) such that when an electronic device such as a mobile device 002 (not depicted in FIG. 1 but depicted in FIGS. 2, 3 and 4) is disposed within the electronic device case 100, a receiving induction coil in electrical communication with electronic device 002 is also disposed within electromagnetic field 200, producing a resulting current $I_2$ (depicted in FIG. 4) for powering the electronic device or charging a battery that is used to power electronic device 002. The invention 001 may further comprise shock absorbing material 101 which may be any compressible material such as, for example and not by way of limitation, Sorbothane®, neoprene, expanded ethylene-vinyl acetate (EVA) foam, poly ethylene-vinyl acetate (PEVA) foam, poly ethylene (PE) foam, or any other compressible material. Shock absorbing material 101 may be disposed between thermoelectric device 103 and mobile device 002, or otherwise disposed in the invention, in order to dampen vibration and impact shock loads such that thermoelectric device 103, generating induction coil 102 and the interconnecting conductors 104 and electrical connections are not damaged when the case of this embodiment of the invention is subjected to expected loads in a particular use.

Still referring to FIG. 1, the invention may also comprise an optional rotary lens feature comprising a hub 106 rotably attached to a surface of the mobile device case 100. Hub 106 may rotate as indicated by arrow A about axis B. One or more lens carriers 105 may be attached to hub 106. Each of the lens carriers 105 may contain an optical lens C, D, E, F, or G. Each optical lens C, D, E, F, or G may be of any optical power. For example, and not by way of limitation, each optical lens C, D, E, F, or G may be a 15× optical power macro lens, a 3× telephoto lens, 0.63× wide angle lens, a 1× lens, no lens at all, or a 180° fisheye lens.

When hub 106 is rotated about axis B, each of the optical lenses C, D, E, F, or G may be sequentially presented to a camera lens opening 107. Camera lens opening 107 may be disposed in mobile device case 100 such that camera lens opening 107 is aligned with and in optical communication with a camera lens or aperture disposed in a surface of mobile device 002. Thus, by rotating hub 106, a user may select any one of lenses C, D, E, F, or G for use with a camera 006 of mobile device 002 (see FIG. 2). While five lenses are depicted in the embodiments shown in the drawings, the optional rotary lens feature of the invention may comprise any number of lenses.

Figure 2:
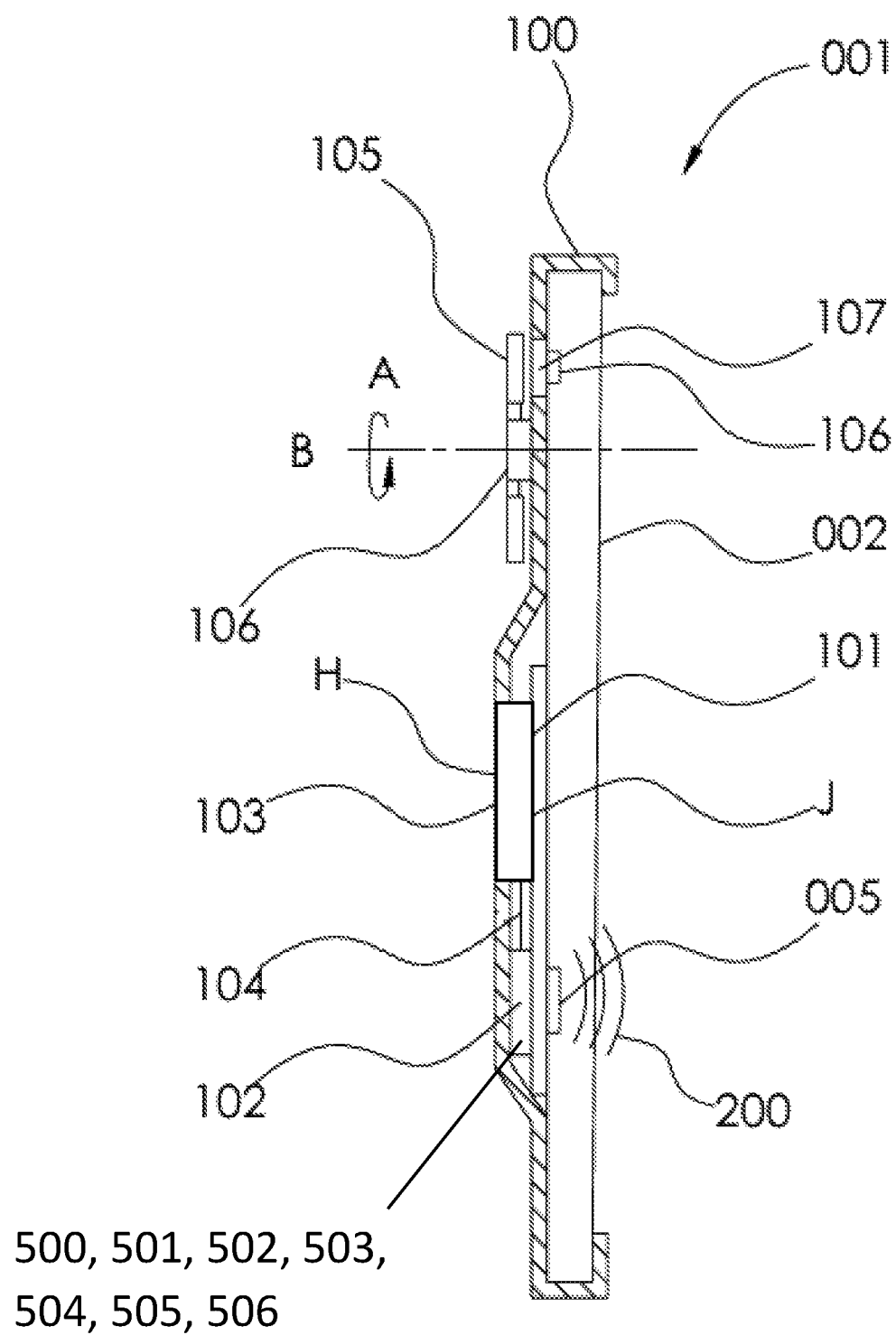
FIG. 2 depicts a cross section side view of an embodiment of the invention.
Figure 3:
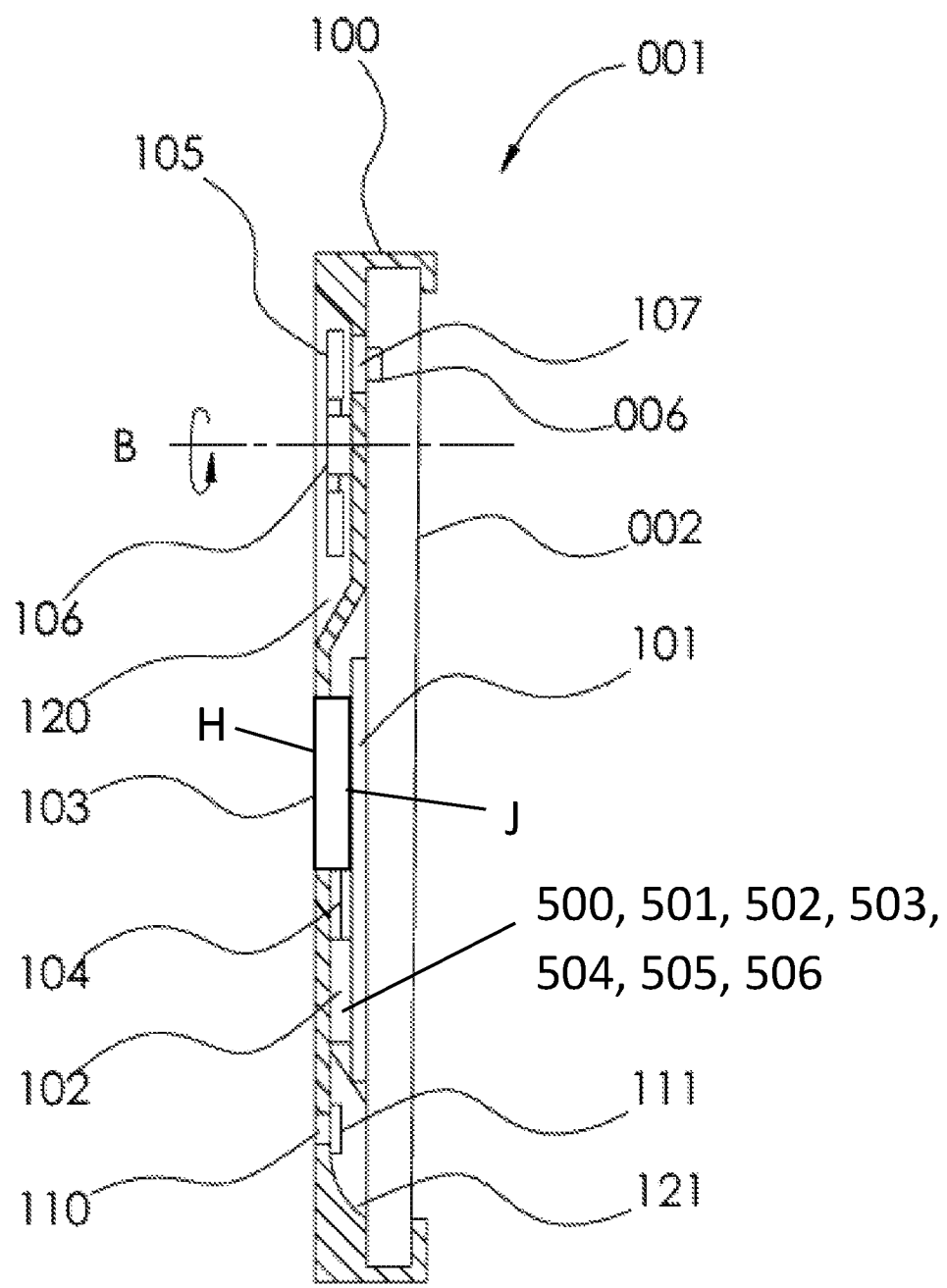
FIG. 3 depicts a cross section side view of an embodiment of the invention in which openings, or slits, are disposed in the battery-powered electric device case of the device to allow cooling air to flow around the thermoelectric device while keeping liquids from passing through the openings or slits in the battery-powered electric device case of the invention.

Referring now to FIGS. 2 and 3, a cross section side view of an embodiment of the invention is depicted in which the invention 001 is embodied as an electronic device case 100. The electronic device case 100 may comprise any material suitable for receiving and retaining electronic device 002. In embodiments, electronic device case 100 may comprise a stretchable material such as silicone that may be stretched to receive electronic device 002. The opening in electronic device case 100 for receiving electronic device 002 may be sized slightly smaller than the exterior dimensions of electronic device 002 such that, when electronic device case 100 has been stretched to receive electronic device 002, electronic device 002 is retained in electronic device case 100 by the forces created on electronic device 002 as the stretchable material comprising electronic device case 100 attempts to return to its lowest energy, or normal, state. Thus electronic device case 100 may be configured to receive and retain an electronic device 002 in a removable attachment that is a snug, or elastic, fit. As hereinbefore described, the electronic device case of the invention 100 may comprise a thermoelectric device 103 in electrical communication with a generating induction coil 102 via electrical conductors 104, which may be electrically conductive wires. The location of generating induction coil 102 may be determined such that generating induction coil 102 produces an electromagnetic field 200 such that when electronic device 002 is disposed within electronic device case 100, a receiving induction coil 003 disposed within electronic device 002 is also disposed within electromagnetic field 200, producing a resulting, or charging, current $I_2$ (depicted in FIG. 4) for directly powering electronic device 002, or for charging a battery that powers electronic device 002. The invention may further comprise shock absorbing material 101 which may be any compressible material such as, for example and not by way of limitation, Sorbothane®, neoprene, silicone, expanded ethylene-vinyl acetate (EVA) foam, poly ethylene-vinyl acetate (PEVA) foam, poly ethylene (PE) foam, or any other compressible, shock absorbing or flexible material. Shock absorbing material 101 may be selected and disposed between thermoelectric device 103 and mobile device 002, providing thermal isolation between thermoelectric device 103 and mobile device 002, or may be otherwise disposed in the invention, in order to provide thermal isolation between thermoelectric device 103 and mobile device 002 and to dampen vibration and impact shock loads such that thermoelectric device 103, generating induction coil 102 and the interconnecting conductors and electrical connections, which may be formed of conductive wiring and wiring interconnections, are not damaged when the enclosure of the invention is subjected to vibration and shock loads in a particular use. The exterior-facing portion, or face, H of thermoelectric device 103 may, but does not necessarily, form a portion of an exterior surface of enclosure 100. In embodiments, exterior-facing portion, or face, H of thermoelectric device 103 may be in contact with a portion of a body of a user, such as the user's skin, bringing externally facing portion H to a temperature of $T_1$ which is higher than the temperature of internally facing portion J, which is at temperature $T_2$ as is further described in relation to FIG. 4 below.

Still referring to FIGS. 2 and 3, optional electronic and electrical elements comprising processor 500, physical storage media 501, audio interface 502, speaker 503, microphone 504, communication port 505 and battery 506 may be located within enclosure 100 and may be, for example and not by way of limitation, mounted onto a printed circuit board that comprises conductive traces that are in electrical communication with each of the aforementioned optional elements for electrically connecting these elements of the invention. The embodiment of these elements depicted in FIGS. 2 and 3 is exemplary only. The optional electronic and electrical elements may be mounted into the enclosure, and electrically interconnected, by any means or structure known in the art.

In embodiments, electronic device enclosure 100 may comprise carbon fiber.

In embodiments in which electronic device enclosure 100 comprises carbon fiber, the carbon fiber material may be electrically conductive.

In embodiments in which enclosure device enclosure 100 comprises carbon fiber, the carbon fiber material may act as a heat sink for a thermoelectric device of the invention.

Referring now to FIG. 2, as hereinbefore described, the invention may comprise an optional rotary lens feature comprising a hub 106 rotably attached to a surface of the mobile device case 100. Hub 106 may rotate as indicated by arrow A about axis B. One or more lens carriers 105 may be attached to hub 106. Each of the lens carriers 105 may contain an optical lens C, D, E, F, or G (not depicted in FIG. 2, but depicted in FIG. 1). Each optical lens C, D, E, F, or G may be of varying optical power. When hub 106 is rotated about axis B, each of the optical lenses C, D, E, F, or G may be sequentially presented to a camera lens opening 107. Camera lens opening 107 may be disposed in mobile device case 100 such that camera lens opening 107 is aligned with and in optical communication with a camera lens or aperture of mobile device camera 006 disposed in a surface of mobile device 002. In an embodiment, camera lens opening 107, lens C, D, E, F, or G (when each of lens C, D, E, F, or G has been rotated into position such that it is optically aligned with, and in optical communication with, camera lens opening 107 and a camera lens or aperture of a camera 006 of mobile device camera 006), and a camera lens or aperture of mobile device camera 006 are each optically and mechanically coaxially disposed along axis B. Thus, by rotating hub 106, a user may select any one of lenses C, D, E, F, or G for use with a camera of mobile device 002.

Figure 6:
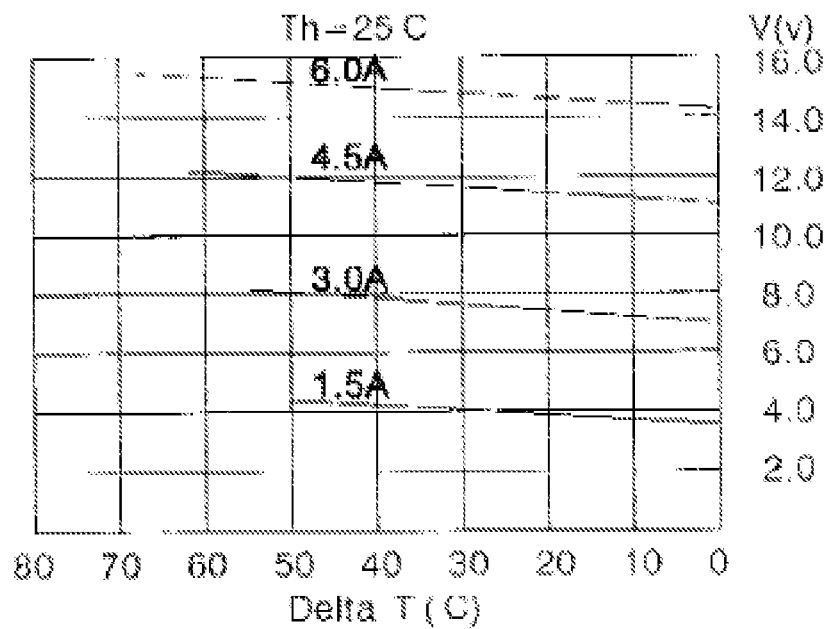
FIGS. 6 and 7 depict power generation curves for this exemplary thermoelectric devices.
Figure 7:
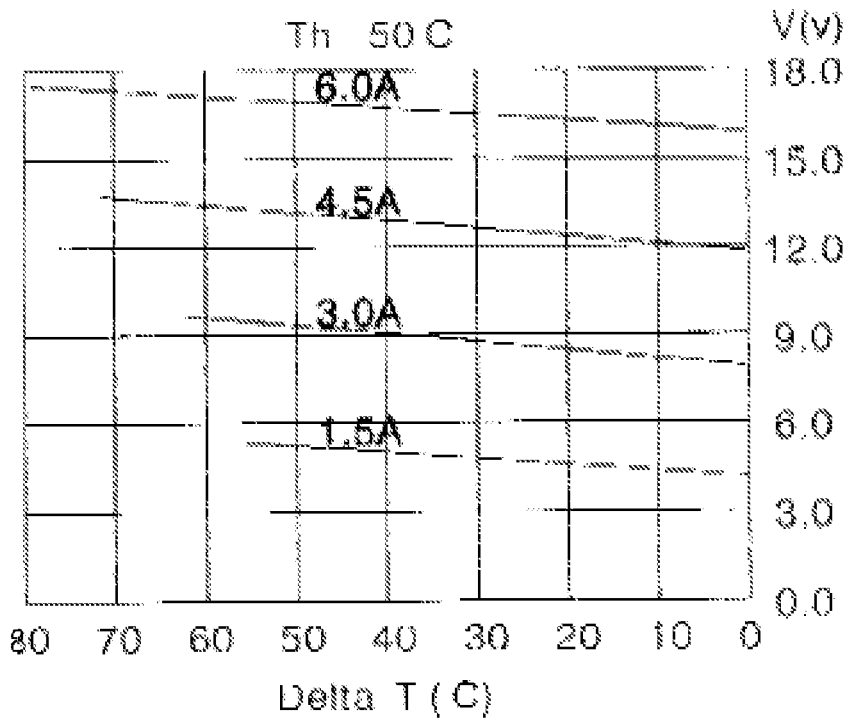

In embodiments, the thermoelectric device 103 may be similar to that produced by HB Electronic Components part no. TEC1-12706. Power generation curves for this exemplary thermoelectric device are depicted in FIGS. 6 and 7.

Referring now to FIG. 3, a cross section side view of an embodiment of the invention that provides some cooling is depicted. Electronic device case 100 may comprise openings, or slits, 110 disposed in the battery-powered electric device case of the invention to allow cooling air to flow around thermoelectric device 103. Fabric 111 may cover openings 100 to prevent liquids from passing through the openings or slits and passing into the battery-powered electric device case of the invention. Fabric 111 may be any fabric or other material through which air may flow, but fluids, such as, for example and not by way of limitation, water, may not flow through. Thus, in an embodiment, fabric 111 allows air flow into void 121 but is not water permeable, thus keeping water and moisture from entering void 121. Void 121 may be present in mobile device case 100 in order to provide an empty volume with mobile device case 100 to allow for air entering case 100 to move, providing a cooling effect to thermoelectric device 103.

Still referring to FIG. 3, an embodiment of a mobile device case of the invention 001 is depicted in which the rotary lens feature, rotable about axis B, that comprises rotary hub 106 and lens holders 105 is disposed within a recess 120 in case 100. This recessed embodiment of the rotary lens feature provides some protection for rotary hub 106 and lenses C, D, E, F, and G. Thermoelectric device 103, generating induction coil 104, camera lens opening 107, and conductors 104 are depicted for reference.

Figure 4A:
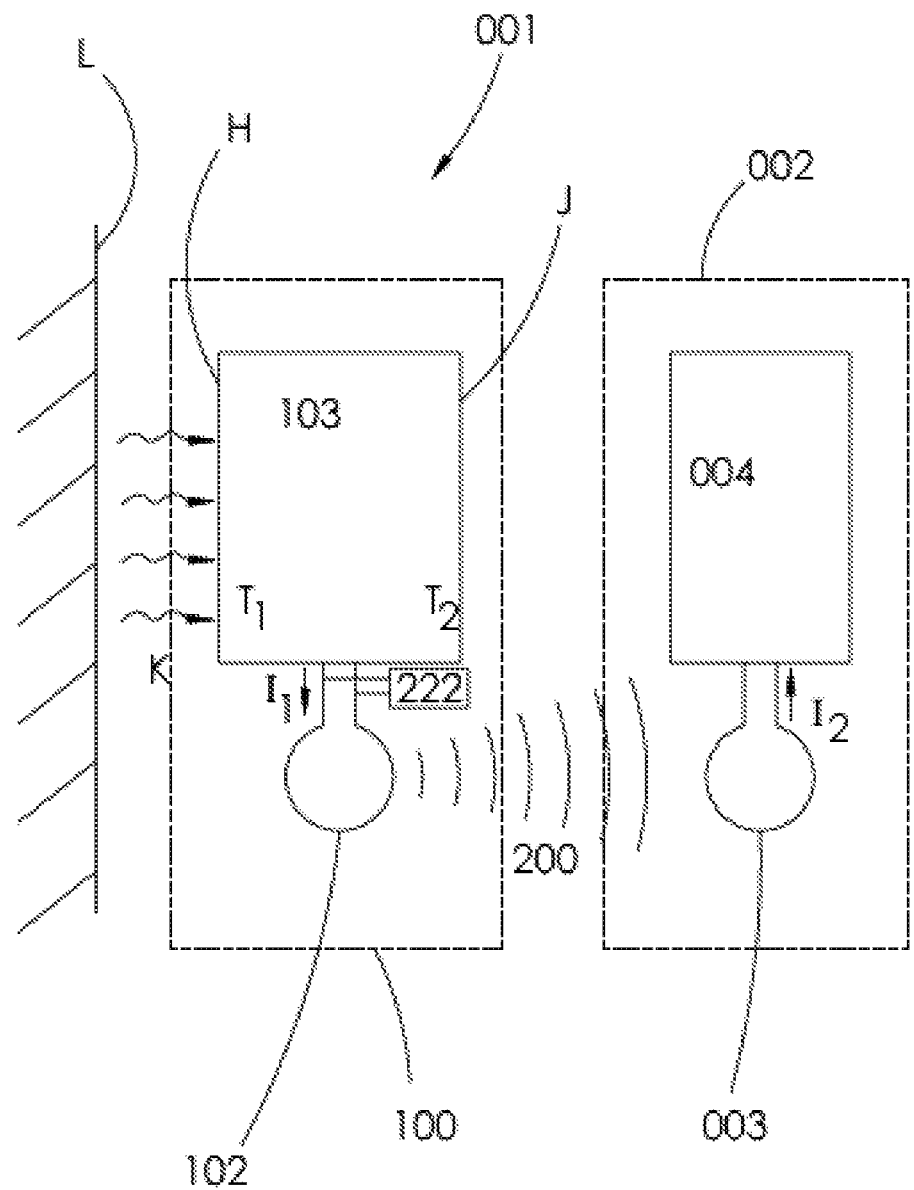
FIG. 4A depicts a block diagram of an embodiment of the invention in which the thermoelectric device is disposed in the enclosure of the invention, depicting the transfer of heat from an external surface, such as a portion of a user's body, to one side of a thermoelectric device, the generation of current by the temperature difference $\Delta T = T_1 - T_2$, the establishment of an electric current running through a generating induction coil, the establishment of an electromagnetic field by the generating induction coil, the wireless transfer of energy from the generating induction coil to a receiving induction coil, and the generation of a resulting electric current in the receiving induction coil that may communicated to an electronic device in order to power the electronic device or to charge the electronic device's battery.
Figure 4B:
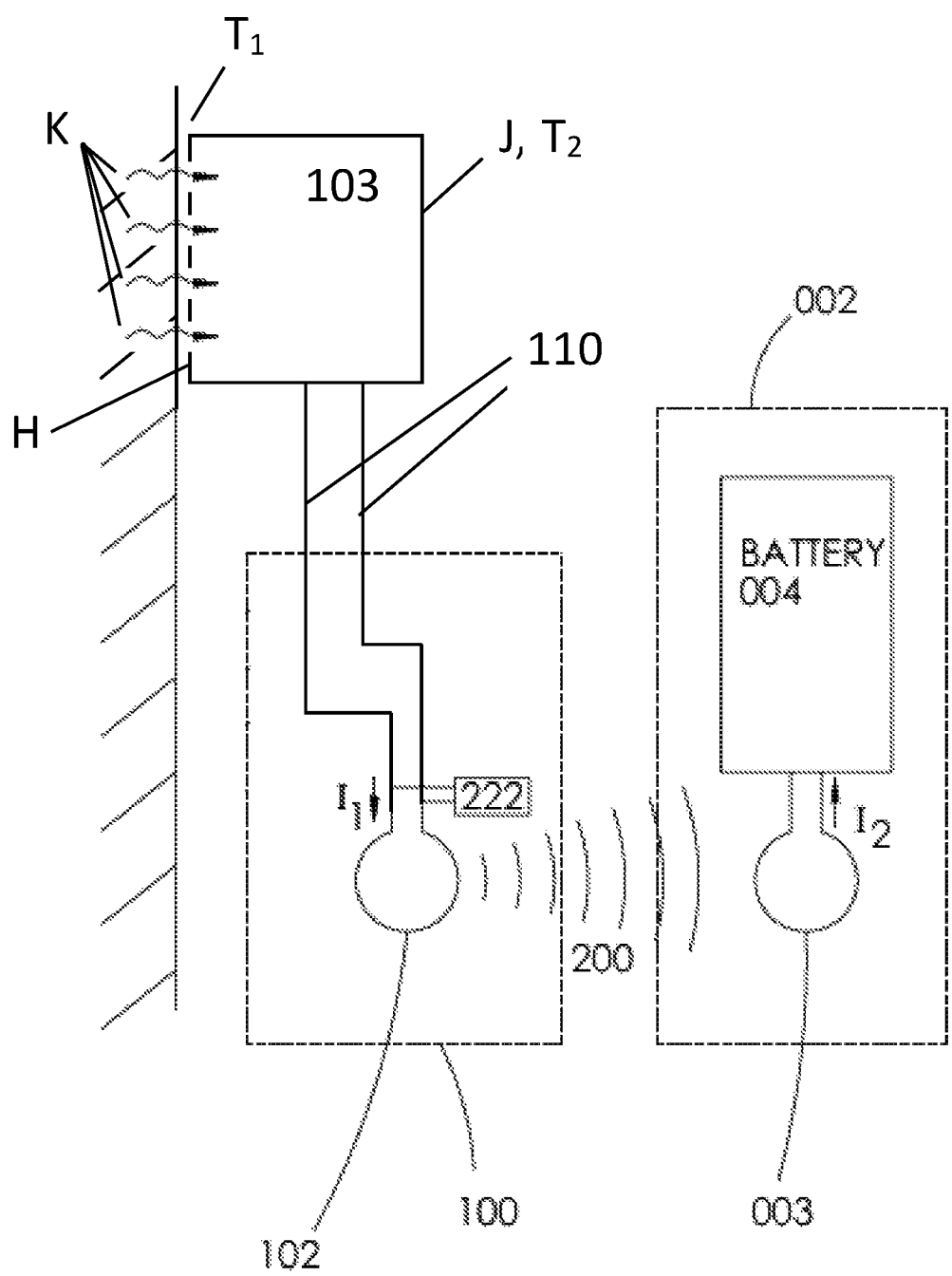
FIG. 4B depicts a block diagram of an embodiment of the invention in which the thermoelectric device is remotely located from the enclosure of the invention, depicting the transfer of heat from an external surface, such as a portion of a user's body, to one side of a thermoelectric device, the generation of current by the temperature difference $\Delta T = T_1 - T_2$, the establishment of an electric current running through a generating induction coil, the establishment of an electromagnetic field by the generating induction coil, the wireless transfer of energy from the generating induction coil to a receiving induction coil, and the generation of a resulting electric current in the receiving induction coil that may communicated to an electronic device in order to power the electronic device or to charge the electronic device's battery.

Referring now to FIG. 4, a block diagram of an embodiment of the invention, depicting the transfer of heat from an external surface, such as a portion of a body of a user, for example, the skin of a user, to one side H of thermoelectric device 102, the generation of an electric current $I_1$ by the temperature difference $\Delta T=T_1-T_2$ in surfaces H and J of thermoelectric device 103, respectively, the establishment of an electric current $I_1$ running through generating induction coil 102, causing the generation of an electromagnetic field 200 by the electric current passing through generating induction coil 102, the inductive wireless transfer of energy from the generating induction coil 102 to a receiving induction coil 003 disposed in electronic device 002, and the generation of a resulting current $I_2$ by the receiving induction coil 003. Thermoelectric device 103 may be received by and retained within enclosure 100. Thermoelectric device 103 may comprise an externally facing portion H and an internally facing portion J. Externally facing portion H of thermoelectric device 103 may form a portion of an exterior surface of enclosure 100 in order to provide maximum thermal conductivity between a heat producing surface L and the externally facing portion H of thermoelectric device 103. Heat producing surface L may be any heat producing surface, but may, in embodiments, be a portion of the body of a user, such as the skin of a user. In such instances, as non-limiting examples, enclosure 100 may be worn on the body of the user, or may be carried on the body of user. Externally facing portion H of thermoelectric device 103 is in direct or indirect thermal communication with heat producing surface L. In this manner, heat K is transferred from heat producing surface L to externally facing portion H of thermoelectric module 103, causing a temperature rise in externally facing portion H, bringing externally facing portion H to a temperature of $T_1$ which is higher than the temperature of internally facing portion J, which is at temperature $T_2$. Thus, a temperature differential $\Delta T=T_1-T_2$ is generated between externally facing portion H and internally facing portion J of thermoelectric module 103. This temperature differential operates on thermoelectric device 103 via a thermoelectric effect to cause charging current $I_1$ to flow through generating induction coil 102, resulting in the generation of electromagnetic field 200. When electronic device 002 is disposed in and received by enclosure 100, a receiving induction coil 003 of mobile device 002 is disposed within electromagnetic field 200, causing a resulting current $I_2$ to provide electric current to electronic device power circuitry 004 which may comprise a battery. Thus the resulting current $I_2$ may power electronic device 002 or may charge a battery that provides power to electronic device 002, or both. In embodiments, electromagnetic field 200 may be a resonant electromagnetic field. In embodiments, electromagnetic field 200 may be an alternating electromagnetic field. In embodiments, a controller or other circuit 122 may be disposed in enclosure 001 and may be in electrical communication with thermoelectric device 103 and generating induction coil 002. Controller or other circuit 122 may modulate or control current $I_1$ such that electromagnetic field 200 produced by generating induction coil 102 is a changing electromagnetic field. In embodiments, the electromagnetic field 200 may conform to an industry standard for inductive charging such as the Qi standard promulgated by the Wireless Power Consortium, the Power Matters Alliance (PMA) standard promulgated by the IEEE Standards Association (IEEE-SA), the Rezence standard promulgated by the Alliance for Wireless Power (A4WP), standards adopted by the AirFuel Alliance, or another industry standard.

In an alternate embodiment, thermoelectric device 103 may be remotely located from enclosure 100 such that it may be disposed in thermal communication with any heat source, which may be, for example, a portion of a body of a user such as the user's skin. Remotely located thermoelectric device 103 may be in electrical communication with generating induction coil 102 via electrically conductive wiring 110. In exemplary embodiments of this version of the invention, the remotely located thermoelectric device 103 may be attached to the heat source by any means known in the art, with the electrically conductive wiring running to enclosure 100 which may be worn on, carried by or attached to, an article of clothing worn by the user. In the case in which the heat source is a portion of a body of a user, the remotely located thermoelectric device 103 may be attached using a strap, a band, a patch, an article of clothing or any other structure that locates thermoelectric device 103 in proximity to a portion of a body of a user such that thermoelectric device 103 is in thermal communication with a portion of a body of a user, which forms heat producing surface L. In such cases, heat producing surface L may be the skin of the user. By way of a non-limiting exemplary use case of such an embodiment, the remotely located thermoelectric device 103 may be held in thermal communication with the skin of a user using a band or strap, with electrical wiring running to generating induction coil 102 that comprises enclosure 100, which may be worn on a belt of the user, or carried by the user in a pocket of an article of clothing, or carried a handbag or backpack.

Figure 5:
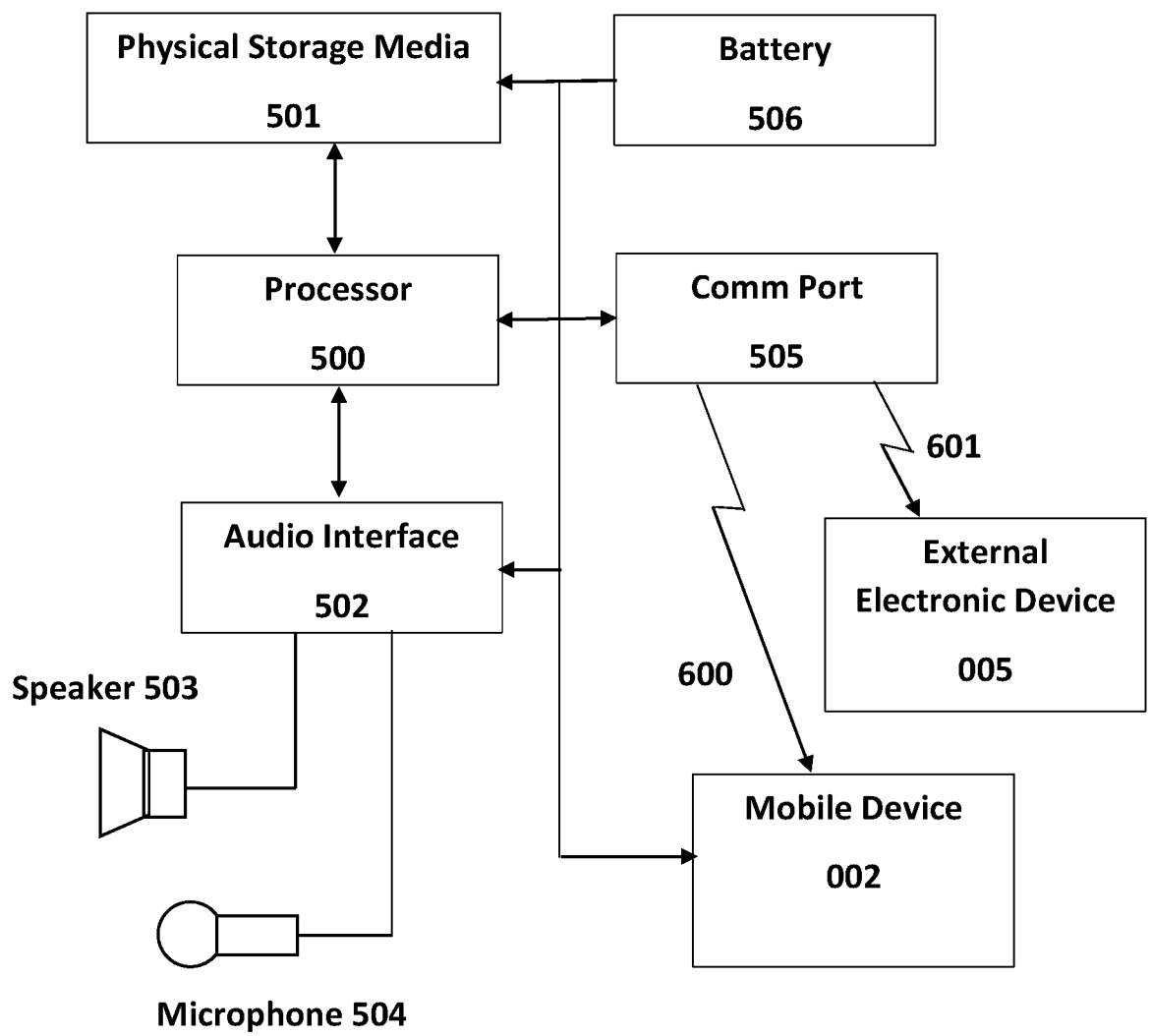
FIG. 5 depicts a block diagram of an embodiment of the invention, depicting the optional processor, physical storage media, and communication elements of the invention.

Referring now to FIG. 5, a block diagram of an embodiment of the system is provided in which a processor is in electrical communication with a physical storage media 501. Physical storage media 501 may contain software that, when read and executed by processor 500, carries out any of the functions of the system of the invention. Processor 500 may be in communication with communication port 505, which may comprise any combination of radio frequency (RF), optical or wired communications with external systems and processors. As an example, communication port 505 may comprise a WiFi® compliant bidirectional RF communication interface, a Near Field Communication (NFC) compliant bidirectional RF communication interface, a Zigbee compliant bidirectional RF communication interface, an optical communication interface, a wired serial or parallel data interface or any other communication interface, RF or otherwise. Communication interface 505 may be in communication with a corresponding wireless communication interface function residing within an electronic device 002, such as a cell phone, that is captured in the enclosure 100 of the invention. Communication interface 505 may also be in communication with a corresponding communication interface function residing within an external electronic device 005, such as a television, camera, audio system or any other type of appliance, so that it may receive commands and be controlled by the invention. Processor 500 may communicate with a processor residing in a mobile device held within enclosure 100 so that virtual assistance software residing in physical storage media 501 may be executed by processor 500 to perform virtual assistant functions, some of which may require communication with a processor residing in an electronic device 002 held within enclosure 100 or may require communication with a processor residing in an external electronic device to be controlled 005. Processor 500 may be in communication with at least one, and in some embodiments, a plurality, of microphones 504, an optional speaker 503, or both. When a user wishes to engage virtual assistant functions of the invention, they may speak certain command words which are received as an audio signal and converted to electrical signals by microphone 504. If the virtual assistant function is programmed to respond audibly to the user, the virtual assistant software residing in physical storage media 501 may be executed by processor 500 which produces an electrical signal representing a desired audio response that is presented to optional speaker 503. Speaker 503 converts the electrical signal representing a desired audio response to an audio signal that may be heard by a user as response to an audio input to the virtual assistant by, for example, speaking into microphone 504. In embodiments, optional speaker 503 may not be present, and the invention may in such cases deliver audio information to a user through the electronic device 002 speaker(s). In such cases, audio information is transmitted from communication port 505 via a wireless or wired link 600 to a complementary receiver in mobile device 002 where it is processed by circuitry within mobile device 002 and transmitted to a speaker in electronic device 002 for conversion to an audio signal to be heard by a user.

Still referring to FIG. 5, in embodiments, the virtual assistant may be operable to receive commands from a user. The virtual assistant may be in communication with at least one external electronic device 005 and may be operable to control the at least one external electronic device 005 by communicating control commands 601 to the external electronic device 005. External electronic device(s) 005 to be commanded by processer 500 may be operable to be commanded or controlled by receiving a command signal 601, which is usually, but not necessarily, a wireless signal. In the cases in which the external electronic device 005 is operable to receive wireless command signals for controlling the external electronic device, such wireless command signals may be any type of wireless signal known in the art, analog signal or digital signal or a combination of analog and digital signals. Such wireless command signals may be RF, optical, electromagnetic and may conform to industry standards such as IEEE 802.11 WiFi®, IEEE 802.15 ZigBee®, Bluetooth or any other industry standards. Such communication of commands may also be transmitted via wired connections between processer 500 and the external electronic device 005.

Still referring to FIG. 5, the invention may further comprise a battery 506 that is in communication with, and receives a charging current from, at least one, and in embodiments, a plurality, of thermoelectric devices 103.

In embodiments, enclosure 100 may be any color or combination of colors. In the case in which enclosure 100 comprises carbon fiber, the color or colors of any surface of enclosure 100 may be determined by the carbon fiber itself, or by any matrix material, resin or polymer material with which the carbon fiber is impregnated and subsequently cured.

In an embodiment, the total thickness of apparatus of the invention, including the enclosure 001, does not exceed 0.7 inches.

What is claimed is:

1. An apparatus for providing electrical energy to an electronic device, comprising:
   an enclosure for receiving an electronic device;
   a thermoelectric generator having an exterior-facing portion and an interior-facing portion, wherein said exterior-facing portion is in thermal communication with the body of a user such that the user's body temperature causes the temperature of said exterior-facing portion of said thermoelectric device to be greater than the temperature of said interior-facing portion of said thermoelectric device, causing the thermoelectric device to generate an electric current; and
   a generating induction coil in electrical communication with said thermoelectric device that generates an electromagnetic field in response to said electric current, wherein said generating induction coil is disposed within said enclosure;
   wherein said generating induction coil converts said electric current into an electromagnetic field for inductively communicating energy to a receiving induction coil when said electronic device is received by said enclosure, causing the receiving induction coil to be placed within the electromagnetic field of said generating induction coil, and wherein said receiving induction coil is in electrical communication either with said electronic device, or with a battery providing electrical power to said electronic device, such that a resulting current produced in said receiving induction coil when said receiving induction coil is placed within the electromagnetic field of said generating induction coil provides electric energy either to 1) said electronic device for powering said electronic device directly in the case in which said receiving induction coil is in electrical communication with said electronic device, or 2) said battery in the case in which said receiving conduction coil is in electrical communication with said battery.

2. The apparatus of claim 1, wherein said electromagnetic field is further defined as an alternating electromagnetic field.

3. The apparatus of claim 1, wherein said electromagnetic field is a resonant electromagnetic field.

4. The apparatus of claim 1, wherein said thermoelectric device is further defined as a Peltier device.

5. The apparatus of claim 1, wherein said electronic device is a mobile device, and wherein said case is adapted to be carried on the body of a user.

6. The apparatus of claim 1, wherein said enclosure further comprises at least one ventilating opening allowing air from outside the enclosure to enter the enclosure and circulate near the thermoelectric device.

7. The apparatus of claim 6, wherein said at least one opening is covered by a watertight breathable fabric that allows said ventilating air to pass through said ventilating opening, but does not allow fluids to pass through said ventilating opening.

8. The apparatus of claim 1, wherein said exterior-facing portion of said thermoelectric device forms a portion of an exterior surface of said enclosure.

9. The apparatus of claim 8, wherein at least a portion of said exterior-facing portion of said thermoelectric device is in direct contact with the skin of the user.

10. The apparatus of claim 1, wherein said at least a portion of said enclosure comprises a composite carbon fiber construction.

11. The apparatus of claim 1, wherein said thermoelectric generator is disposed in said enclosure.

12. The apparatus of claim 1, further comprising a processor in communication with a physical storage media capable of storing computer readable and executable instructions, wherein said processor is in communication with a communication port that is capable of communicating with a communication port of a mobile device that is disposed in said enclosure.

13. The apparatus of claim 12, wherein said physical storage media contains non-transitory computer readable and executable instructions for commanding said processor to perform predefined tasks.

14. The apparatus of claim 12, wherein said physical storage media contains non-transitory computer readable and executable instructions for a virtual assistant function.

15. The apparatus of claim 14, wherein said virtual assistant is operable to receive voice commands from a user, and wherein said virtual assistant is in communication with at least one external electronic device and is operable to control said at least one external electronic device by communicating control commands to said external device.

16. An apparatus for providing electrical energy to an electronic device, comprising:
- an enclosure for receiving an electronic device;
- a thermoelectric generator having an exterior-facing portion and an interior-facing portion, wherein said exterior-facing portion is in thermal communication with the body of a user such that the user's body temperature causes the temperature of said exterior-facing portion of said thermoelectric device to be greater than the temperature of said interior-facing portion of said thermoelectric device, causing the thermoelectric device to generate an electric current; and
- a generating induction coil in electrical communication with said thermoelectric device that generates an electromagnetic field in response to said electric current;
- wherein said generating induction coil converts said electric current into an electromagnetic field for inductively communicating energy to a receiving induction coil when said electronic device is received by said enclosure, causing the receiving induction coil to be placed within the electromagnetic field of said generating induction coil, and wherein said receiving induction coil is in electrical communication either with said electronic device, or with a battery providing electrical power to said electronic device, such that a resulting current produced in said receiving conduction coil when said receiving induction coil is placed within the electromagnetic field of said generating induction coil provides electric energy either to 1) said electronic device for powering said electronic device directly in the case in which said receiving induction coil is in electrical communication with said electronic device, or 2) said battery in the case in which said receiving conduction coil is in electrical communication with said battery.

17. The apparatus of claim 16, wherein said electromagnetic field is further defined as an alternating electromagnetic field.

18. The apparatus of claim 16, wherein said electromagnetic field is a resonant electromagnetic field.

19. The apparatus of claim 16, wherein said thermoelectric device is further defined as a Peltier device.

20. The apparatus of claim 16, wherein said electronic device is a mobile device, and wherein said case is adapted to be carried on the body of a user.

21. The apparatus of claim 16, wherein said enclosure further comprises at least one ventilating opening allowing air from outside the enclosure to enter the enclosure and circulate near the thermoelectric device.

22. The apparatus of claim 21, wherein said at least one opening is covered by a watertight breathable fabric that allows said ventilating air to pass through said ventilating opening, but does not allow fluids to pass through said ventilating opening.

23. The apparatus of claim 16, wherein said exterior-facing portion of said thermoelectric device forms a portion of an exterior surface of said enclosure.

24. The apparatus of claim 23, wherein at least a portion of said exterior-facing portion of said thermoelectric device is in direct contact with the skin of the user.

25. The apparatus of claim 16, wherein said at least a portion of said enclosure comprises a composite carbon fiber construction.

26. The apparatus of claim 16, wherein said thermoelectric generator is disposed in said enclosure.

27. The apparatus of claim 16, further comprising a processor in communication with a physical storage media capable of storing computer readable and executable instructions, said physical storage media in communication with a processor, and wherein said processor is in communication with a communication port that is capable of communicating with a communication port of a mobile device that is disposed in said enclosure.

28. The apparatus of claim 27, wherein said physical storage media contains non-transitory computer readable and executable instructions for commanding said processor to perform predefined tasks.

29. The apparatus of claim 27, wherein said physical storage media contains non-transitory computer readable and executable instructions for a virtual assistant function.

30. The apparatus of claim 29, wherein said virtual assistant is operable to receive voice commands from a user, and wherein said virtual assistant is in communication with at least one external electronic device and is operable to control said at least one external electronic device by communicating control commands to said external device.

* * * * *